(12) United States Patent
Toda et al.

(10) Patent No.: US 11,106,152 B2
(45) Date of Patent: Aug. 31, 2021

(54) IMAGE FORMING APPARATUS

(71) Applicant: CANON KABUSHIKI KAISHA, Tokyo (JP)

(72) Inventors: Atsushi Toda, Fuji (JP); Naoki Fukushima, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/842,579

(22) Filed: Apr. 7, 2020

(65) Prior Publication Data

US 2020/0341404 A1    Oct. 29, 2020

(30) Foreign Application Priority Data

Apr. 24, 2019    (JP) .............................. JP2019-083126

(51) Int. Cl.
  *G03G 15/02*    (2006.01)
  *G03G 15/00*    (2006.01)
  *G01R 19/165*   (2006.01)

(52) U.S. Cl.
  CPC ... *G03G 15/0266* (2013.01); *G01R 19/16528* (2013.01); *G03G 15/0216* (2013.01); *G03G 15/5037* (2013.01); *G03G 2215/021* (2013.01)

(58) Field of Classification Search
  CPC .......... G03G 15/0266; G03G 15/0216; G03G 15/5037
  See application file for complete search history.

(56) References Cited

U.S. PATENT DOCUMENTS

| | | | | |
|---|---|---|---|---|
| 2004/0213594 | A1* | 10/2004 | Takayanagi | G03G 15/0131 399/66 |
| 2013/0148991 | A1* | 6/2013 | Sakata | G03G 13/22 399/48 |
| 2015/0104207 | A1 | 4/2015 | Sakato | |
| 2015/0130886 | A1* | 5/2015 | Yaguchi | G03G 15/043 347/224 |
| 2015/0177665 | A1* | 6/2015 | Saito | G03G 15/553 399/25 |
| 2016/0259263 | A1 | 9/2016 | Kato | |
| 2018/0101108 | A1* | 4/2018 | Yaguchi | G03G 15/0266 |

FOREIGN PATENT DOCUMENTS

| | | |
|---|---|---|
| EP | 2605073 A1 | 6/2013 |
| JP | 5939783 B2 | 6/2016 |
| JP | 2016-164605 A | 9/2016 |
| JP | 2017-049498 A | 3/2017 |
| JP | 2018-10131 A | 1/2018 |

\* cited by examiner

*Primary Examiner* — Carla J Therrien
(74) *Attorney, Agent, or Firm* — Canon U.S.A., Inc. I.P. Division

(57) ABSTRACT

In a state that a first voltage is applied to a charging member so as to form a surface potential on a region of an image bearing member and a second voltage the same in polarity as the first voltage is applied to a transfer member, a detection unit detects a transfer current in the region of the image bearing member during one rotation of the image hearing member after the region passes through a charging portion, when an absolute value of the surface potential formed on the region immediately before entry into the charging portion is larger than an absolute value of the surface potential formed on the region when it is positioned upstream of a transfer portion and downstream of the charging portion in a rotational direction of the image bearing member.

12 Claims, 11 Drawing Sheets

FIG.8
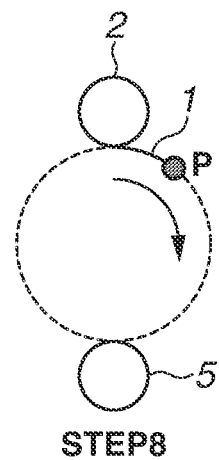
STEP8
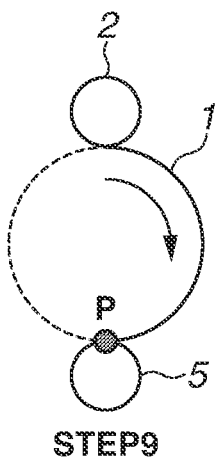
STEP9
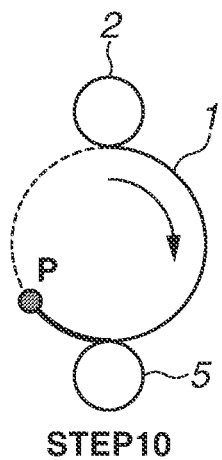
STEP10
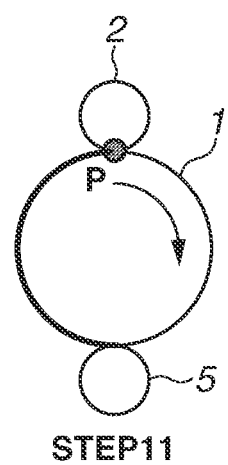
STEP11
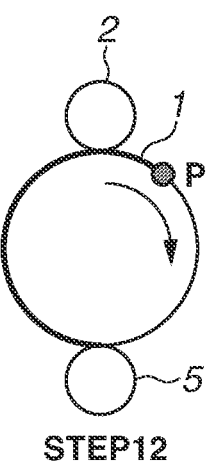
STEP12
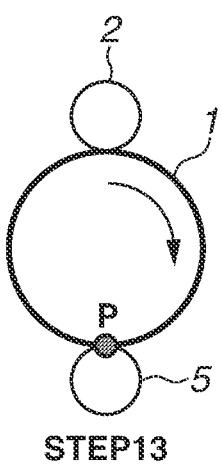
STEP13 though the transfer portion with the transfer voltage applied to the transfer member during one rotation of the image bearing member after the region passes through the charging portion.
IMAGE FORMING APPARATUS

BACKGROUND OF THE DISCLOSURE

Field of the Disclosure

The present disclosure relates to an image forming apparatus using an electrophotographic recording method, such as a laser printer, a copying machine, and a facsimile machine.

Description of the Related Art

An image forming apparatus forms an electrostatic latent image by evenly charging a surface of an electrophotographic photosensitive member (hereinafter referred to as a photosensitive drum or a drum) using a charging member and exposing the charged surface of the photosensitive drum using an exposure unit. Then, the image forming apparatus develops this electrostatic latent image using a development unit to form a toner image with a developer (hereinafter referred to as toner), and transfers this toner image onto a recording material using a transfer member. After that, the image forming apparatus fixes the toner image onto the recording material using a fixing unit, and outputs it as an image. On the other hand, transfer residual toner remaining on the surface of the photosensitive drum after the transfer of the toner image is removed by a cleaning member, by which the surface of the photosensitive drum is cleaned and prepared for the next image forming operation.

An image quality (PQ: Print Quality) for acquiring an excellent image considerably depends on a surface potential of the photosensitive drum. This surface potential of the photosensitive drum is affected by a reduction in the layer thickness of the photosensitive drum due to the surface of the photosensitive drum scraped by a printing operation, an increase in resistance and contamination of the charging member, an environmental change, and the like. Optimum PQ control should be performed by correctly determining the surface potential of the photosensitive drum according to such a change.

Japanese Patent No. 5939783 discusses a configuration that determines positive and negative discharge start voltages by detecting currents flowing in a photosensitive drum when a positive voltage and a negative voltage are applied to a transfer roller, respectively, and calculates a middle point therebetween as the surface potential of the photosensitive drum.

However, applying the transfer voltage to the transfer roller to detect the current flowing in the photosensitive drum may cause a discharge at a transfer portion and thus lead to a change in the surface potential of the photosensitive drum between before and after the photosensitive drum passes through the transfer portion. In recent years, in a configuration unequipped with an alternating-current (AC) charger and a pre-exposure unit for stabilizing the surface potential of the photosensitive drum, with the aim of further increasing the lifetime thereof, there is a case where the image forming apparatus especially fails to stably control the surface potential of the photosensitive drum and appropriately carry out the current detection.

SUMMARY OF THE DISCLOSURE

The present disclosure is directed to allowing even the configuration achieving the increase in the lifetime to accurately carry out the current detection.

According to a first aspect of the disclosure, an image forming apparatus includes a rotatable image bearing member, a charging member configured to form a charging portion by contacting the image bearing member and charge a surface of the image bearing member at the charging portion, a transfer member configured to form a transfer portion by contacting the image bearing member and transfer a region of the image bearing member where a surface potential is formed on the surface of the image bearing member charged by the charging member at the transfer portion, a charging voltage application unit configured to apply a charging voltage including a direct-current component to the charging member, a transfer voltage application unit configured to apply a transfer voltage to the transfer member, a detection unit configured to detect a transfer current flowing from the transfer member to the image bearing member, and a control unit configured to control the charging voltage application unit and the transfer voltage application unit, wherein, with the image bearing member rotating, the control unit controls the charging voltage application unit to apply the charging voltage to the charging member so as to form the surface potential on the region and controls the transfer voltage application unit so as to apply the transfer voltage the same in polarity as the charging voltage to the transfer member, and wherein, when an absolute value of the surface potential formed on the region of the image bearing member immediately before entry into the charging portion is larger than an absolute value of the surface potential formed on the region of the image bearing member when it is positioned upstream of the transfer portion and downstream of the charging portion in a rotational direction of the image bearing member, the detection unit detects the transfer current when the region passes Further features of the present invention will become apparent from the following description of exemplary embodiments with reference to the attached drawings.

BRIEF DESCRIPTION OF THE DRAWINGS

FIG. 8 illustrates a change in the surface potential of the photosensitive drum when the current detection is carried out while the negative transfer voltage is applied according to the first exemplary embodiment.

DESCRIPTION OF THE EMBODIMENTS

In the following description, how the present disclosure can be embodied will be described exemplarily in detail based on exemplary embodiments thereof with reference to the drawings. However, dimensions, materials, shapes, a relative layout, and the like of components that will be described in these exemplary embodiments shall be changed as appropriate according to a configuration of an apparatus to which the present disclosure is applied and various kinds of conditions. In other words, they are not intended to limit the scope of the present disclosure to the following exemplary embodiments.

1. Image Forming Apparatus

Figure 1:
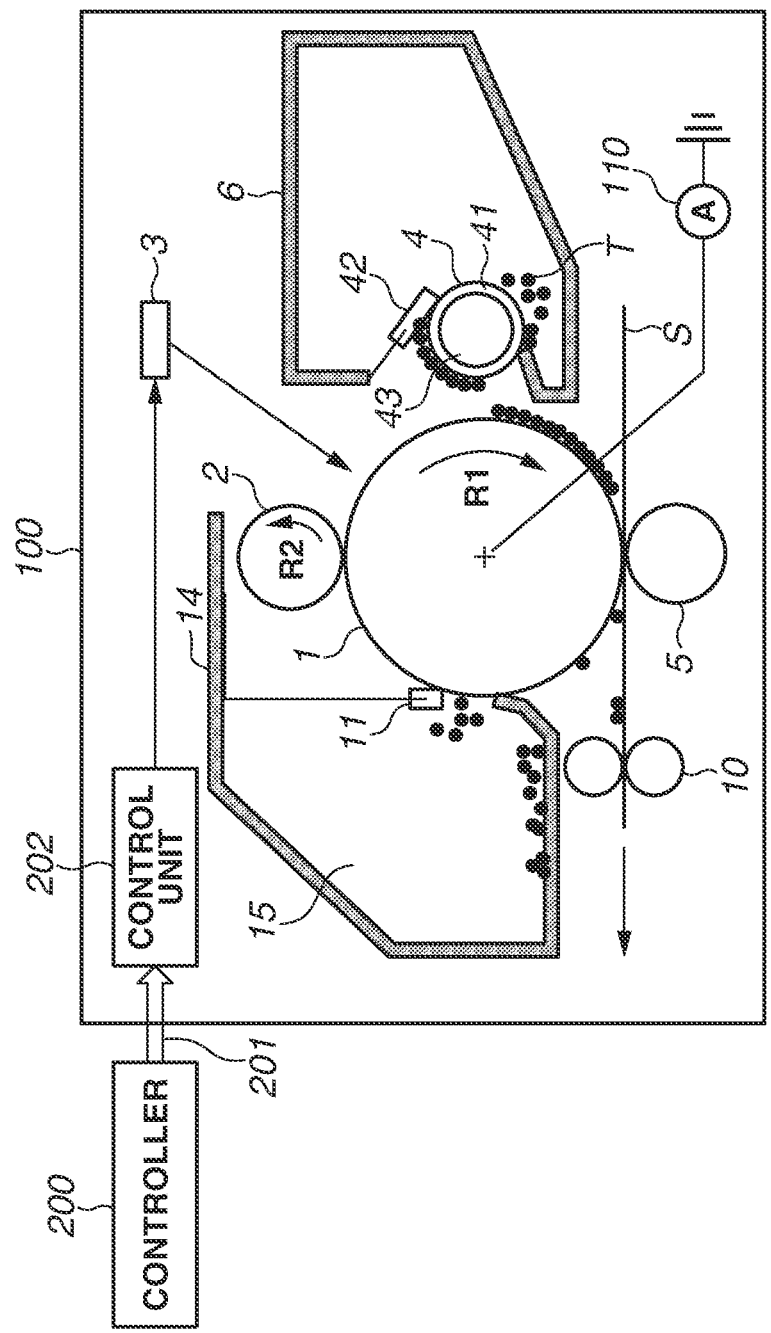
FIG. 1 is a schematic view of an image forming apparatus according to a first exemplary embodiment.

FIG. 1 illustrates an example of an image forming apparatus using the electrophotographic method according to an exemplary embodiment of the present disclosure.

A photosensitive drum 1, which is a drum-type image bearing member as a charging target member, is disposed in an image forming apparatus 100. The photosensitive drum 1 is constructed by providing a photosensitive material, such as an organic photoconductor (OPC), amorphous selenium, or amorphous silicon, on a drum base in the form of a cylinder having Φ=24 mm that is made from aluminum, nickel, or the like. The photosensitive drum 1 is rotatably supported by the image forming apparatus 100, and is rotationally driven at a process speed of 150 mm/s in a direction indicated by an arrow R1 by a driving motor M. In the first exemplary embodiment, the thickness of the photosensitive material is set to 15 μm.

A surface of the photosensitive drum 1 is evenly charged so as to have a predetermined polarity and potential by a charging roller 2 subjected to an application of a charging voltage (a charging bias), which is a direct-current (DC) voltage. The charging roller 2 is a single-layered roller including a conductive core metal and a conductive rubber layer, and the volume resistivity thereof is $10^3$ to $10^6$ Ω·cm. The charging roller 2 is in abutment with the photosensitive drum 1 at a charging portion. The charging roller 2 rotates around the conductive core metal serving as an axis thereof in a direction indicated by an arrow R2 in FIG. 1 by being driven by the rotation of the photosensitive drum 1. Further, a charging voltage application unit 21, which can apply a negative direct-current voltage, is connected to the conductive core metal.

Figure 2:
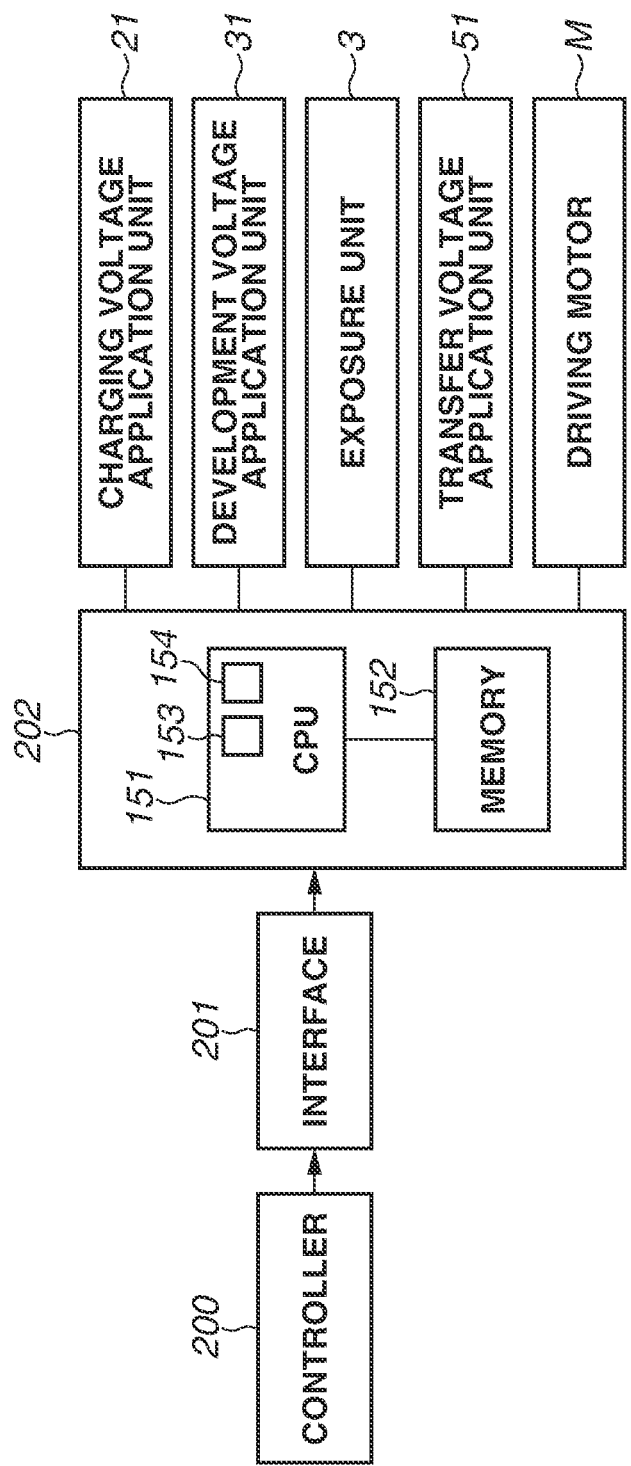
FIG. 2 is a control block diagram according to the first exemplary embodiment.

The surface of the photosensitive drum 1 after the charging is exposed by an exposure unit 3, which is an exposure unit, thereby forming a latent image thereon. For the exposure unit 3, a chronological electric digital pixel signal indicating image information processed by image processing is input from a printer controller 200 to a control unit 202 via an interface 201 as illustrated in FIGS. 1 and 2. The exposure unit 3 includes a laser output unit that outputs laser light modulated in correspondence with the input chronological electric digital pixel signal, a rotational polygonal mirror (a polygon mirror), an fθ lens, a reflective mirror, and the like. The exposure unit 3 carries out a main scan exposure on the surface of the photosensitive drum 1 with laser light L. An electrostatic latent image according to the image information is formed by this main scan exposure and sub scan by the rotation of the photosensitive drum 1.

The electrostatic latent image formed on the photosensitive drum 1 is developed (visualized) as a toner image using toner T as a developer by a development member 4 as a development unit. Further, the image forming apparatus 100 includes a development container 6, and the development member 4 rotatably supported by the development container 6 includes a development sleeve 41 as a developer bearing member. Black toner T, which is a magnetic mono-component developer as the developer, is contained in the development container 6. The toner T according to the first exemplary embodiment is negatively charged characteristic toner. In other words, the normal polarity (the charged polarity at the time of development) of the toner T is a negative polarity in the first exemplary embodiment. The development sleeve 41 is disposed so as to be partially exposed to outside in an opening portion provided at a development portion, which is a location of the development container 6 that faces the photosensitive drum 1. The development sleeve 41 is made of a hollow non-magnetic metal element tube represented by an aluminum element tube. A magnet roller 43 as a magnetic field generation unit is fixedly disposed in the hollow portion of the development sleeve 41. The toner T contained in the development container 6 is supplied to a surface of the development sleeve 41. The toner T supplied to the surface of the development sleeve 41 is formed into an even thin layer by passing through a portion facing a development blade 42 as a developer regulation unit according to a rotation of the development sleeve 41. Then, the toner T is negatively charged with the aid of triboelectric charging. After that, the toner T on the development sleeve 41 is conveyed to the development portion facing the photosensitive drum 1 according to the rotation of the development sleeve 41. Then, the toner T is transferred onto the photosensitive drum 1 according to the electrostatic latent image on the photosensitive drum 1, thereby developing the electrostatic latent image on the photosensitive drum 1. At this time, a predetermined development voltage (a development bias), which is a negative direct-current voltage, is applied to the development sleeve 41 from a development power source 31 as a development voltage application unit illustrated in FIG. 2. In the first exemplary embodiment, the toner image is formed by reversal development onto an image formation portion formed by an exposure process on the surface of the photosensitive drum 1. More specifically, the toner T charged so as to have the same polarity as a charging potential on the photosensitive drum 1 (the negative polarity in the first exemplary embodiment) is attached onto an image formation region, which is an exposure region where the photosensitive drum 1 has a reduced absolute value of the surface potential by being exposed after being evenly subjected to the charging processing.

The toner image formed on the photosensitive drum 1 is delivered to a transfer portion that is a portion where the photosensitive drum 1 and a transfer roller 5, which is a roller-type transfer member as a transfer unit, are in contact with each other. A member used as the transfer roller 5 includes a conductive core metal, and a conductive sponge-like rubber mainly containing a nitrile butadiene rubber (NBR) and an epichlorohydrin rubber, which are an elastic material, at a portion in pressure-contact with the photosensitive drum 1, and is 12.5 mm in outer diameter and 30° in hardness (measured by Asker-C under a load of 500 gf). Without a recording material S interposed at the transfer portion, the photosensitive drum 1 and the transfer roller 5 are in abutment with each other at the transfer portion, which is the position in abutment with the transfer roller 5, and the transfer roller 5 rotates around the conductive core metal serving as an axis thereof by being driven by the rotation of the photosensitive drum 1. Further, a transfer voltage application unit 51, which can apply a positive or negative transfer voltage (a transfer bias), is connected to the conductive core metal.

Further, the recording material S such as a recording sheet, which is a transfer target material, is conveyed to the transfer portion while synchronizing a timing thereof based on the toner image on the photosensitive drum 1. Then, the toner image on the photosensitive drum 1 is transferred onto the recording material S conveyed while being sandwiched between the photosensitive drum 1 and the transfer roller 5 due to an action of the transfer roller 5 at the transfer portion. At this time, a predetermined transfer voltage, which is a direct-current voltage with a polarity (the positive polarity in the first exemplary embodiment) opposite from the normal polarity of the toner T, is applied from the transfer voltage application unit 51 illustrated in FIG. 2 to the transfer roller 5. As a result, an electric field is formed between the transfer roller 5 and the photosensitive drum 1, and the toner image is electrostatically transferred from the photosensitive drum 1 onto the recording material S. The recording material S with the toner image transferred thereon is delivered to a fixing unit 10 as a fixing unit. Heat and a pressure are applied to the recording material S and the toner image transferred on the recording material S is fixed onto the recording material S at the fixing unit 10.

On the other hand, the toner T remaining on the surface of the photosensitive drum 1 without being transferred onto the recording material S at the transfer portion is removed by a cleaning member 11 in abutment with the photosensitive drum 1 at a cleaning portion, and is collected into a waste toner container 15.

In the image forming apparatus 100 according to the first exemplary embodiment, four process devices, namely, the photosensitive drum 1, the charging roller 2, the development member 4, and the cleaning member 11 are integrally built in a cartridge container, and form a process cartridge 14 detachably attachable to the image forming apparatus 100.

In the first exemplary embodiment, the image foxing apparatus 100 is equipped with the charging high-voltage power source 21 serving as the charging voltage application unit, and the transfer high-voltage power source 51 serving as the transfer voltage application unit, which are high-voltage circuits that apply voltages for measuring the surface potential of the photosensitive drum 1 to the charging roller 2 and the transfer roller 5, respectively, before the image formation. Further, the image forming apparatus 100 is equipped with a detection unit 110, which is a detection circuit that detects a current flowing to the earth via the photosensitive drum 1 due to the transfer voltage applied to the transfer roller 5. A negative voltage can be applied to the charging voltage application unit 21, and both a voltage the same in polarity as the charging voltage and a voltage opposite in polarity from the charging voltage can be applied to the transfer voltage application unit 51.

Further, the image forming apparatus 100 includes a memory 152, which stores a history of the voltage applied to the transfer roller 5 and a relationship between the applied voltage and the detected current flowing in the photosensitive drum 1 that is detected by the detection unit 110. Further, a central processing unit (CPU) 151 includes a calculation unit 153, which calculates a linear expression and a discharge start voltage from a plurality of relationships between the applied voltage and the detected current, and an arithmetic unit 154, which determines the surface potential of the photosensitive drum 1 by arithmetically processing this calculated value. Due to this configuration, the image forming apparatus 100 can calculate even a target value of the voltage to apply based on a predetermined detection result. A control configuration according to the first exemplary embodiment will be described in detail.

The controller 200 provides and receives various kinds of electric information to and from a host apparatus. Then, the control unit 202 comprehensively controls the image forming operation of the image forming apparatus 100 according to a predetermined control program and a reference table. FIG. 2 is a block diagram illustrating a schematic control configuration of main portions of the image forming apparatus 100 according to the first exemplary embodiment. The image forming apparatus 100 is equipped with the control unit 202 as a control unit that comprehensively controls an operation of each unit of the image forming apparatus 100. The control unit 202 includes, for example, the CPU 151, which is a key element that performs various kinds of arithmetic processing, and the memory 152 including a read only memory (ROM) and a random access memory (RAM), and the like which each are a storage element. The RAM stores therein a detection result of a sensor, a count result of a counter, an arithmetic result, and the like. The ROM stores therein a control program, a data table acquired from an experiment or the like in advance, and the like, Each control target in the image forming apparatus 100, the sensor, the counter, and the like are connected to the control unit 202.

The control unit 202, for example, controls a predetermined image forming sequence by controlling provision/reception of various kinds of electric information signals, a driving timing of each of the units, and the like. For example, the voltages applied to the charging roller 2, the development sleeve 41, and the transfer roller 5 by the driving motor M, the charging voltage application unit 21, the development voltage application unit 31, and the transfer voltage application unit 51 are controlled by the control unit 202. Then, the image forming apparatus 100 forms an image on the recording material S based on an electric image signal input from the host apparatus to the controller 200. Examples of the host apparatus include an image reader (a document image reading apparatus), a personal computer, a facsimile machine, and a smartphone.

In the exemplary embodiments that will be described from now, the image forming apparatus 100 will be described assuming that the voltage applied to the charging roller 2 is negative (negative in polarity). In other words, the negative polarity is employed as the normal polarity. Therefore, the voltage applied to the charging roller 2 is opposite in polarity when the voltage applied to the transfer roller 5 is positive (positive in polarity) and the same in polarity when the voltage applied to the transfer roller 5 is negative in polarity.

2. Surface Potential of Photosensitive Drum

Next, the surface potential of the photosensitive drum 1 will be described. As the direct-current voltage applied to the charging roller 2 increases, the surface potential of the photosensitive drum 1 is unchanged until this voltage reaches a certain voltage value. However, the surface potential of the photosensitive drum 1 starts to increase after the applied voltage reaches the certain voltage value. Now, the increase in the surface potential of the photosensitive drum 1 means that the surface potential increases on the negative polarity side, and indicates that an absolute value of the surface potential increases. The value of the direct-current voltage at which the surface potential of the photosensitive drum 1 starts to increase is a discharge start voltage Vth. In the first exemplary embodiment, the initial discharge start voltage Vth is assumed to be −500 V by way of example. The discharge start voltage Vth is determined based on a gap between the charging roller 2 and the photosensitive drum 1, the thickness of the photosensitive member layer of the photosensitive drum 1, the relative permittivity of the photosensitive member layer of the photosensitive drum 1, and the like. Therefore, the discharge start voltage Vth varies according to the printing operation and the rotational operation of the photosensitive drum 1. When a direct-current voltage equal to or higher than the discharge start voltage Vth is applied to the charging roller 2, a discharge phenomenon occurs in the gap between the charging roller 2 and the photosensitive drum 1 based on Paschen's Law. Due to the discharge phenomenon, a charge is placed on the surface of the photosensitive drum 1 and a potential is formed on the surface of the photosensitive drum 1. In other words, when the direct-current voltage equal to or higher than the discharge start voltage Vth is applied to the charging roller 2, the surface potential of the photosensitive drum 1 starts to increase. After that, the surface potential of the photosensitive drum 1 increases according to a linear relationship at a gradient of substantially one with respect to the direct-current voltage applied to the charging roller 2. Therefore, a direct-current voltage Vd+Vth should be applied to the charging roller 2 to acquire a surface potential Vd of the photosensitive drum 1, which is deemed as necessary for electrophotography. When the direct-current voltage Vd+Vth is applied to the charging roller 2, the discharge occurs between the photosensitive drum 1 and the charging roller 2, and the potential is formed on the surface of the photosensitive drum 1 by an amount corresponding to the direct-current voltage Vd.

In the first exemplary embodiment, the charging voltage to apply at the time of image formation, the discharge start voltage Vth, the charging potential (a dark portion potential) Vd, and a light portion potential Vl are set to −1100 V, −500 V, −600 V, and −200 V, respectively. The development voltage is set to Vpp=1800 V, and a direct-current component is set to Vdc=−450 V. Now, the development voltage in the first exemplary embodiment is expressed as a potential difference from the earth potential. Therefore, the development voltage=−450 V is interpreted to mean that a potential difference of −450 V is generated from the earth potential (0 V) due to the development voltage applied to the core metal of the development sleeve 41. The same also applies to the charging voltage. Hereinafter, when the development voltage applied to the development sleeve 41 or the charging voltage applied to the charging roller 2 is expressed as the potential difference, this may be referred to as a development potential, a charging potential, or the like.

3. Positive Current Detection Using Transfer Roller

First, an outline of current detection of a current flowing in the photosensitive drum 1 according to the first exemplary embodiment will be described. To calculate the surface potential of the photosensitive drum 1 according to the first exemplary embodiment, positive and negative discharge start voltages Vth1 and Vth2, which will be described below, should be detected by applying the transfer current or the transfer voltage to the transfer roller 5 while changing it, on the surface of the photosensitive drum 1 after the charging, and detecting the current flowing in the photosensitive drum 1. Then, the surface potential of the photosensitive drum 1 can be determined by arithmetic. At this time, the arithmetic unit 154 included in the CPU 151 carries out the arithmetic by storing an arithmetic result and also storing a relational expression between the applied voltage (an applied voltage value) and the detected current (a detected current value) together therewith.

A relationship VI (hereinafter, each point will be referred to as a VI point, and a linear relational expression of the VI point will be referred to as a VI line) is acquired by applying a transfer voltage (V) to the transfer roller 5 and detecting a transfer current (I) at this time with the photosensitive drum 1 rotating. Then, the positive and negative discharge start voltages and a predetermined VI point are acquired by utilizing a change in a gradient of the VI line due to the discharge start voltage Vth based on symmetry between positive and negative VI lines thereof. Then, the surface potential of the photosensitive drum 1 is determined by calculating a voltage corresponding to a central voltage c, which is a middle point between these values.

Figure 3:
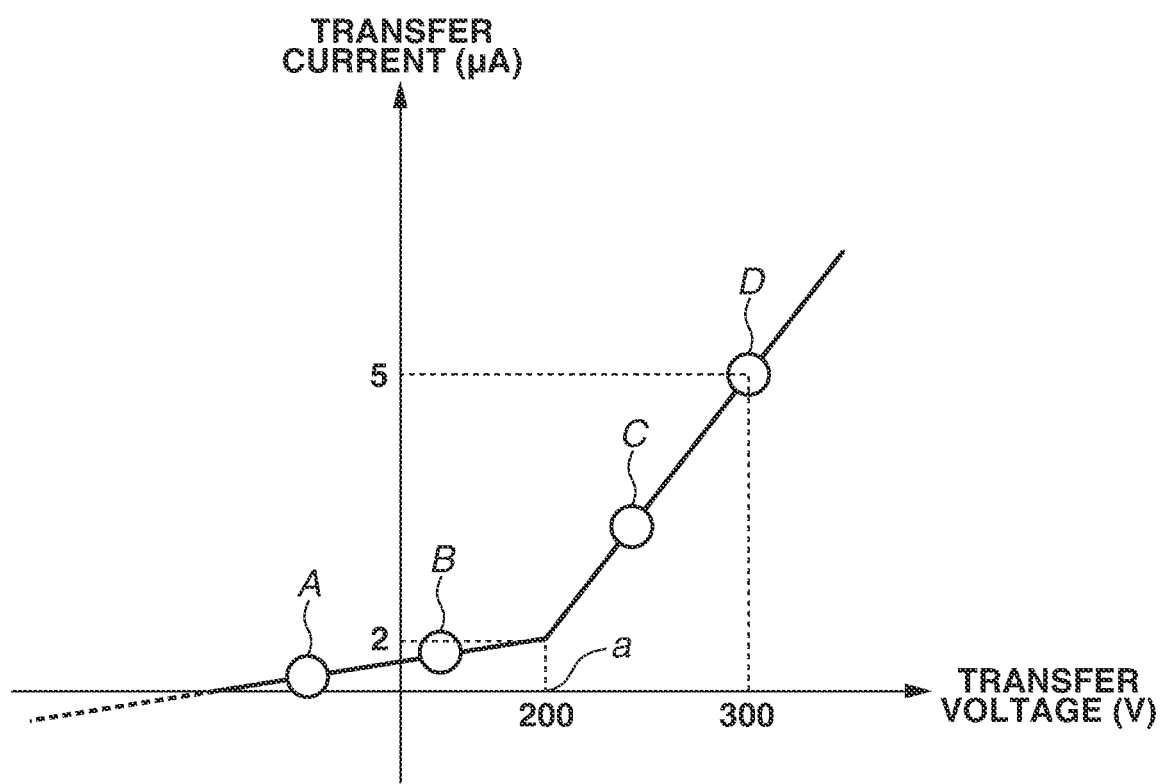
FIG. 3 illustrates a relationship between a positive transfer voltage and a detected current according to the first exemplary embodiment.

A relationship between the transfer voltage and the transfer current while positive current detection is in progress will be described with reference to FIG. 3. FIG. 3 illustrates the transfer voltage applied to the transfer roller 5 on a horizontal axis, and the current value acquired as a result of detecting the current flowing in a drum earth connected to the photosensitive drum 1 on a vertical axis. FIG. 3 illustrates a relationship confirmed by applying the transfer voltage (V) while gradually increasing the voltage value of the transfer voltage to apply to the transfer roller 5, and detecting the transfer current (I) flowing in the photosensitive drum 1. Hereinafter, numerical values of voltages and currents illustrated in the drawings and described in the present description in the first exemplary embodiment merely indicate representative values in the first exemplary embodiment, and the numeral values are not limited to these examples.

Referring to FIG. 3, the VI point and the VI line when the transfer current is positive in polarity will be described. In FIG. 3, a point labeled a corresponds to the positive discharge start voltage Vth1. A point labeled A and a point labeled B before the transfer voltage reaches the point a in FIG. 3 are regions in which no discharge occurs between the transfer roller 5 and the surface of the photosensitive drum 1 when the transfer voltage gradually increases from 0 V. Therefore, the relationship between the transfer voltage and the detected current in the photosensitive drum 1 is linear including the VI points at the point A and the point B. After that, the discharge starts near +200 V, which is the point labeled a, as the applied voltage increases. When entering the region in which the discharge occurs, the relationship starts to exhibit a sharp gradient while remaining linear. This is because the current is detected with an amount corresponding to the discharged current added thereto. More specifically, the current value increases because both the current derived from the resistance and the current derived from the discharge flow in the photosensitive drum 1 in the discharge occurrence region like a point labeled C and a point labeled D in FIG. 3. The discharge start voltage Vth can be determined based on an inflection point at which the gradient of the VI line changes. The positive discharge start voltage Vth1 in this case is +200 V at the point a, and the detected current at this time is 2 µA. The VI line draws a gentle curve near the inflexion point actually, but the inflexion point is simplified and illustrated as an intersection point between a straight line and a straight line for convenience of the description in the drawing in the first exemplary embodiment. Further, the transfer voltage is +300 V and the detected current is +5 µA at the point D equal to or higher than the positive discharge start voltage Vth1. This is a value used to calculate the surface potential of the photosensitive drum 1 as the positive point D (+300 V, +5 µA) later.

From this method, the point A, the point B, and the VI line thereof, and the discharge start voltage Vth1, the point C, the point D, and the VI line thereof can be determined in the positive current detection.

The above-described current detection of the photosensitive drum 1 in which the transfer voltage is positive in polarity is the current detection when the charging voltage is negative in polarity and the transfer voltage is positive in polarity, and these voltages are opposite in polarity from each other. Therefore, the surface potential of the photosensitive drum 1 that shifts to the positive polarity after the transfer can be easily returned to the negative surface potential of the photosensitive drum 1 by the charging voltage. More specifically, the surface potential of the photosensitive drum 1 after the transfer never exceeds the absolute value of the surface potential of the photosensitive drum 1 after the charging, and this allows the surface potential of the photosensitive drum 1 after the charging and before the transfer to be stably formed, so that the current detection can continue without any intervention.

Next, a flow of the positive current detection will be described in detail with reference to a flowchart of FIG. 4 and a schematic cross-sectional view of FIG. 5.

The positive current detection corresponds to steps from S101 to S107 in the flowchart of FIG. 4, and is carried out in the following manner. By this procedure, the image forming apparatus 100 can detect the positive VI point, calculate the positive VI line, and calculate the positive discharge start voltage Vth1.

S101: Start the positive detection operation.
S102: Drive the photosensitive drum 1.
S103: Apply the charging voltage.

In the first exemplary embodiment, the negative direct-current voltage is applied to the charging roller 2.

S104: Apply the transfer voltage.

The positive direct-current voltage, which is opposite in polarity from the charging voltage, is applied to the transfer roller 5 with the surface potential formed on the photosensitive drum 1.

S105: Detect the current in the photosensitive drum 1.

The current flowing to the drum earth connected to the photosensitive drum 1 in reaction to the applied transfer voltage is detected and stored.

S106: Detect the VI point on the positive polarity side, calculate the VI line, and calculate the discharge start voltage Vth1.

step S104 to step S106 are repeated (NO in step S106) until the detection and the calculation are ended in step S106 (YES in step S106).

S107: End the positive detection.

The state of the surface potential around the photosensitive drum 1 when the positive current detection is carried out according to the above-described flowchart will be described with reference to the schematic cross-sectional view of FIG. 5. A circle mark and a thickness of a solid line and a dotted line in the drawing indicate the surface potential and a base point P. A thick solid line on the photosensitive drum 1 indicates the surface of the photosensitive drum 1 with the surface potential formed thereon after the passing through the charging portion at which the charging voltage is applied to the charging roller 2. A thin solid line on the photosensitive drum 1 indicates the surface of the photosensitive drum 1 with the surface potential changed to the positive polarity side due to the discharge at the time of passing through the transfer portion at which the transfer voltage is applied. A thin dotted line on the photosensitive drum 1 indicates the surface of the photosensitive drum 1 on which no surface potential is formed. The base point P indicates a point on the surface of the photosensitive drum 1 that is first charged immediately after the photosensitive drum 1 starts to rotate.

The state of the surface potential will be described in order starting from STEP 1 in FIG. 5. The photosensitive drum 1 is driven to rotate from STEP 1 in which the photosensitive drum 1 is in a stationary state, and the base point P transitions to STEP 2. In STEP 2, the base point P on the snake of the photosensitive drum 1, which is negatively charged at the charging portion where the charging roller 2 and the photosensitive drum 1 are in abutment with each other, moves toward the transfer portion. In STEP 3, the charged base point P reaches the transfer portion. Then, the positive transfer voltage is applied to the transfer roller 5, and the current detection is started to detect the current flowing in the photosensitive drum 1. In STEP 4 after the base point P passes through the transfer portion, the current detection of the current flowing in the photosensitive drum 1 still continues. At this time, the surface potential of the photosensitive drum 1 at the base point P that has passed through the transfer portion shifts to the positive polarity side due to the discharge. More specifically, the surface potential having a small absolute value compared to the surface potential of the photosensitive drum 1 formed due to the discharge with the charging roller 2 is formed at the base point P. For example, supposing that the surface potential of the photosensitive drum 1 is −300 V, the surface potential of the photosensitive drum 1 that has passed through the transfer portion reduces to approximately −200 V when the transfer voltage applied to the transfer portion is +400 V. This is a result of the occurrence of the discharge at the transfer portion and a reduction in the negative charge formed on the photosensitive drum 1, and thus a reduction in the absolute value of the surface potential of the photosensitive drum 1. In a subsequent step, STEP 5, the base point P at which the surface potential of the photosensitive drum 1 shifts to the positive polarity side reaches the charging portion again. Then, the base point P is charged again by the charging roller 2 by an amount corresponding to the shift. When the surface potential is formed at the base point P on the photosensitive drum 1 due to the discharge again, in STEP 6, the base point P recharged by the charging roller 2 moves toward the transfer portion again according to the rotation of the photosensitive drum 1. Then, in STEP 7, the base point P reaches the transfer portion again, and the current detection is carried out. At this time, even after the photosensitive drum 1 completes one rotation after the transfer voltage is applied, the surface potential of the photosensitive drum 1 before the entry into the transfer portion is stabilized by being recharged at the charging portion. This allows the detection to be continuously carried out. In other words, the image forming apparatus 100 can carry out a plurality of measurements such as the detection of the VI point equal to or higher than the discharge start voltage Vth including the discharge start voltage Vth. Therefore, the transfer voltage to apply may be changed so as to differentiate the current value detected in STEP 3 and the current value detected in STEP 7 when the positive current is detected. Alternatively, the improvement of the accuracy may be attempted by acquiring an average value of a section current by continuously detecting the current while applying equal transfer voltages in STEP 3 and STEP 7. This is followed by repeatedly changing the transfer voltage and detecting the current after rotating the photosensitive drum 1 a predetermined number of times, as a result of which the accuracy of the positive current detection is improved.

4. Negative Current Detection Using Transfer Roller

Next, the current detection carried out when the negative transfer voltage is applied will be described. The positive current detection is carried out in the above-described manner, but desired detection cannot be achieved by carrying out the detection while switching only the polarity to the positive polarity for the detection on the negative polarity side. When the negative current detection is carried out, both the charging voltage to apply to the charging roller 2 and the transfer voltage to apply to the transfer roller 5 are negative in polarity, and are the same in polarity as each other. Under this condition, when the absolute value of the transfer voltage to apply to the transfer roller 5 exceeds the absolute value of the charging voltage to apply to the charging roller 2, the absolute value of the surface potential of the photosensitive drum 1 increases due to the discharge at the transfer portion. The surface potential of the photosensitive drum 1 on which the absolute value increases cannot be canceled at the charging portion capable of applying only a negative direct-current voltage. Therefore, the absolute value of the surface potential of the photosensitive drum 1 undesirably increases compared to the surface potential after the charging every time the photosensitive drum 1 goes full circle and passes through the transfer portion according to the rotation thereof. The direct-current charging can increase the surface potential of the photosensitive drum 1 having a small absolute value to the surface potential of the photosensitive drum 1 having a large absolute value by the charging portion, but cannot reduce the surface potential of the photosensitive drum 1 having a large absolute value to the surface potential of the photosensitive drum 1 having a small absolute value by using only a negative voltage. In the first exemplary embodiment, the image forming apparatus 100 is unequipped with a configuration such as a pre-exposure unit intended to evenly equalize the surface potential of the photosensitive drum 1 after the transfer, and an application of an alternating-current (AC) voltage as the charging voltage. One conceivable method is to first change the surface potential to VI by exposing the surface using the exposure unit 3. However, exposing the photosensitive drum 1 every time the detection is carried out leads to deterioration of the sensitivity of the photosensitive drum 1 and generation of a discharge product, thereby resulting in occurrence of an adverse effect in the image. It is difficult to reduce the absolute value of the surface potential of the photosensitive drum 1 without using the above-described method.

Under these circumstances, in the first exemplary embodiment, detection different from the positive current detection is carried out as the negative current detection. More specifically, the negative current detection is carried out based on information acquired at the time of the positive current detection, i.e., the information stored in the memory 152. The negative VI point is detected by using information about a difference between the voltages applied from the initial state to the positive discharge start voltage Vth1, and information about the VI point having a value equal to or higher than the discharge start voltage Vth or the VI line, which are acquired from the positive current detection. This method eliminates the necessity of seeking the negative discharge start voltage Vth2, and requires the negative current detection to be carried out only once. Therefore, the negative current detection can be achieved in a shorter time than the positive current detection.

The positive and negative VI lines are shaped approximately horizontally symmetrically with respect to the central voltage c (point-symmetrically) in the current detection using the transfer roller 5 according to the first exemplary embodiment, assuming that the surface potential of the photosensitive drum 1 corresponds to the central voltage c. Therefore, a negative VI point corresponding to the point D (+300 V, +5 µA) acquired from the positive current detection illustrated in FIG. 3 is estimated using this characteristic, and the actually estimated transfer voltage is applied. A reason for selecting the positive point D at this time is that the positive point D is a transfer voltage equal to or higher than the discharge start voltage Vth and therefore has a certain high value as the current value of the current flowing in the photosensitive drum 1 and is less susceptible to extremely small current noise. A further reason is that the surface potential of the photosensitive drum 1 that is formed at the time of the detection is close to an actually used image forming condition and is accurate.

Figure 6:
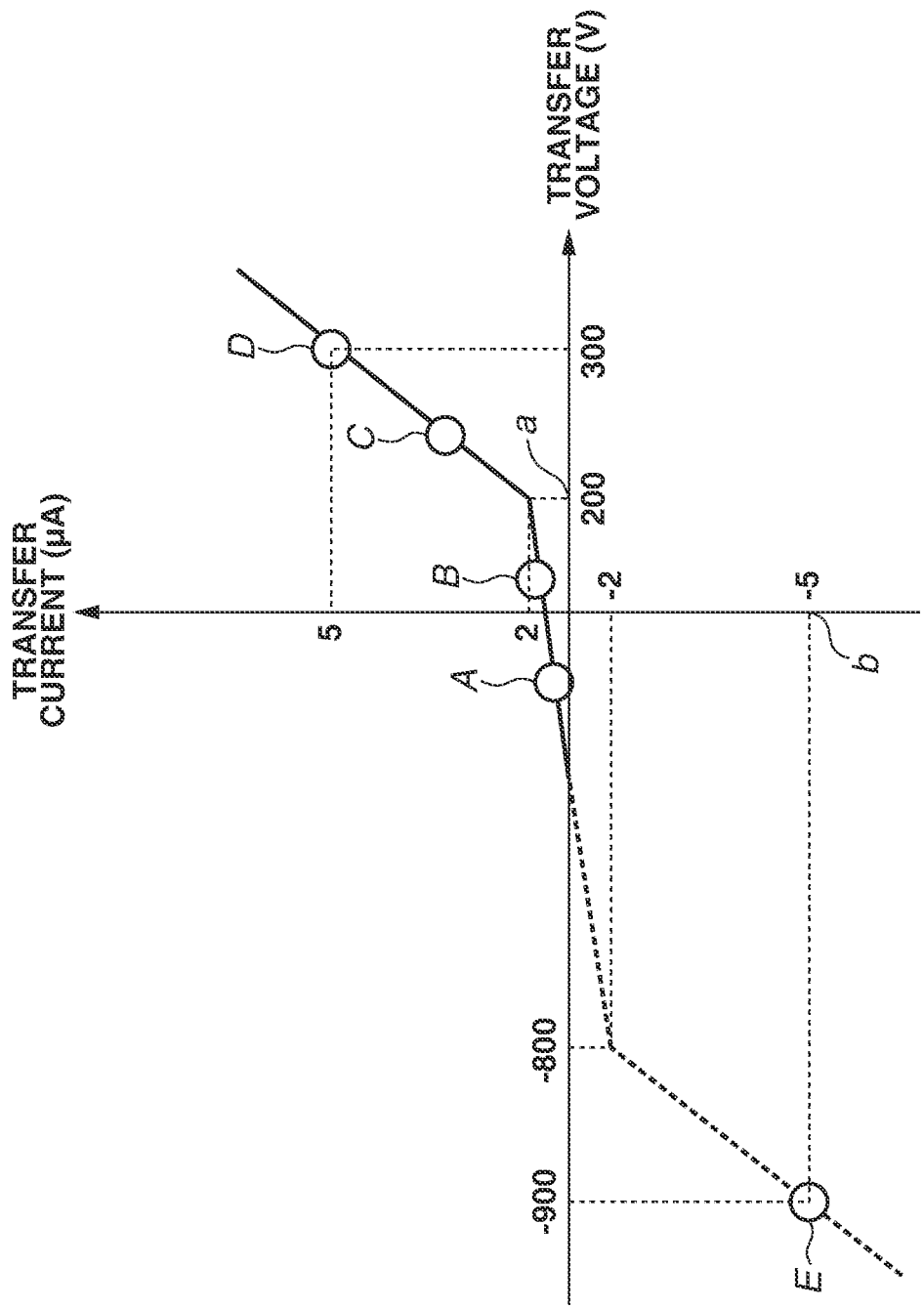
FIG. 6 illustrates a relationship between a transfer voltage and a detected current according to the first exemplary embodiment.

The method for determining the negative VI point will be described with reference to FIG. 6. First, a point labeled E, which is a negative VI point, is calculated based on a voltage difference from the initial state to the applied voltage with which the point D (+300 V, +5 µA) is acquired. A voltage difference in the transfer voltage of the point E from the initial state is estimated to be approximately 600 V based on the relationship between the transfer current and the potential difference stored in the memory 152. Then, a voltage difference between the point D and the point E can be calculated to be 600 V×2=1200 V by the calculation unit 153 and the arithmetic unit 154. Since the transfer voltage at the point D is +300 V, a transfer voltage of −900 V is applied as the point E. As a result, a current value of −5 µA, which is a point labeled b, is detected, and therefore the point E (−900 V, −5 µA), which is a negative VI point, can be acquired. Therefore, the point D and the point E are confirmed to be located point-symmetrically with respect to the central voltage c.

Subsequently, a timing and a duration of the negative current detection will be described. As described above, since the charging voltage and the transfer voltage are the same in polarity as each other as the characteristic of the negative current detection, the absolute value of the surface potential of the photosensitive drum 1 after the passing through the transfer portion increases every time the photosensitive drum 1 completes one rotation. In the first exemplary embodiment, the negative current detection is characterized in that the detection is carried out within one rotation of the drum 1 since the end of the positive current detection and the application of the negative transfer voltage. This characteristic allows the negative current to be stably detected in the state of the surface potential of the photosensitive drum 1 before the passing through the transfer portion, before the absolute value of the surface potential of the photosensitive drum 1 after the passing through the transfer portion exceeds the absolute value of the surface potential of the photosensitive drum 1 after the passing through the charging portion.

The method for the negative current detection will be described with reference to a flowchart of FIG. 7 and a schematic cross-sectional view of FIG. 8.

Figure 4:
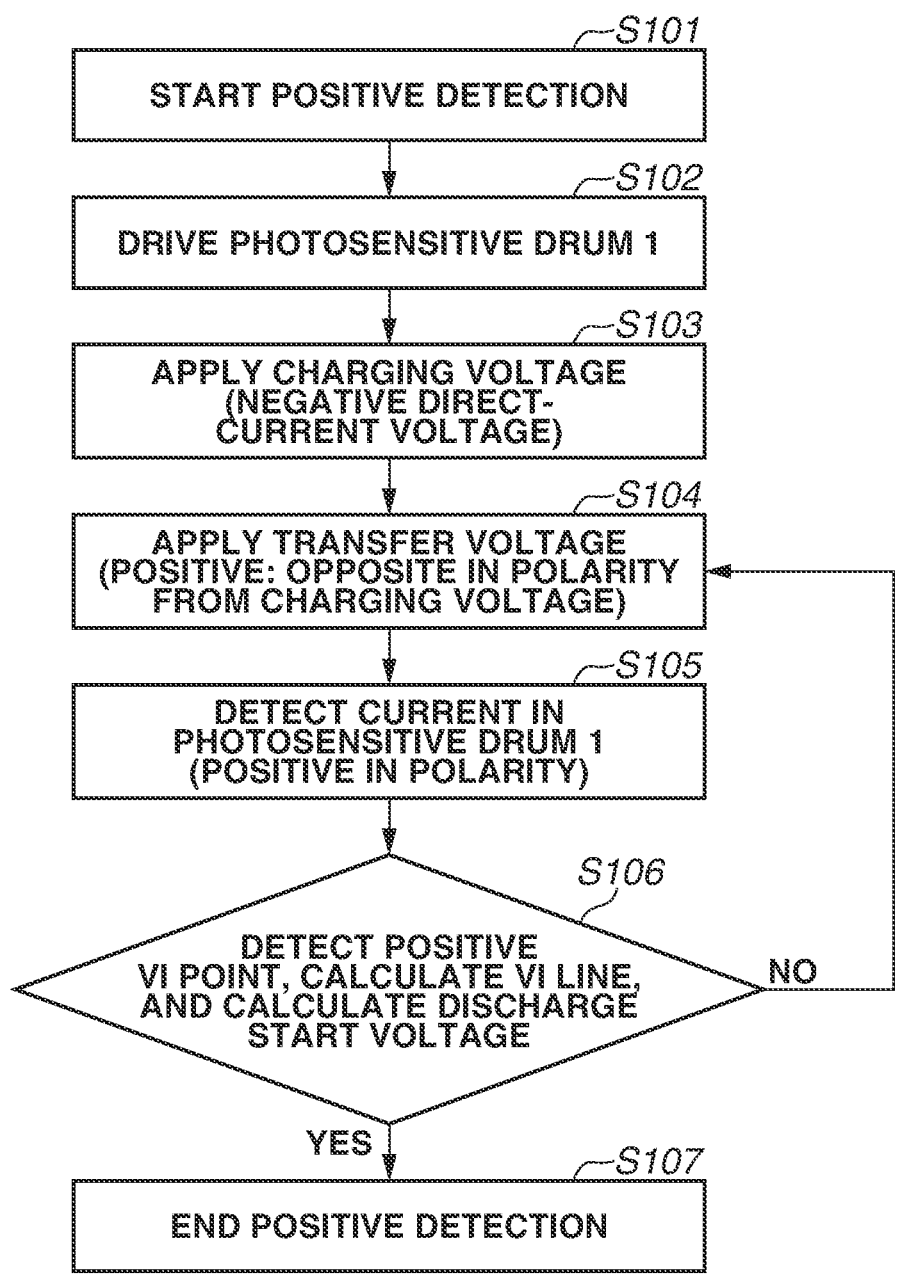
FIG. 4 is a flowchart of current detection when the positive transfer voltage is applied according to the first exemplary embodiment.
Figure 5:
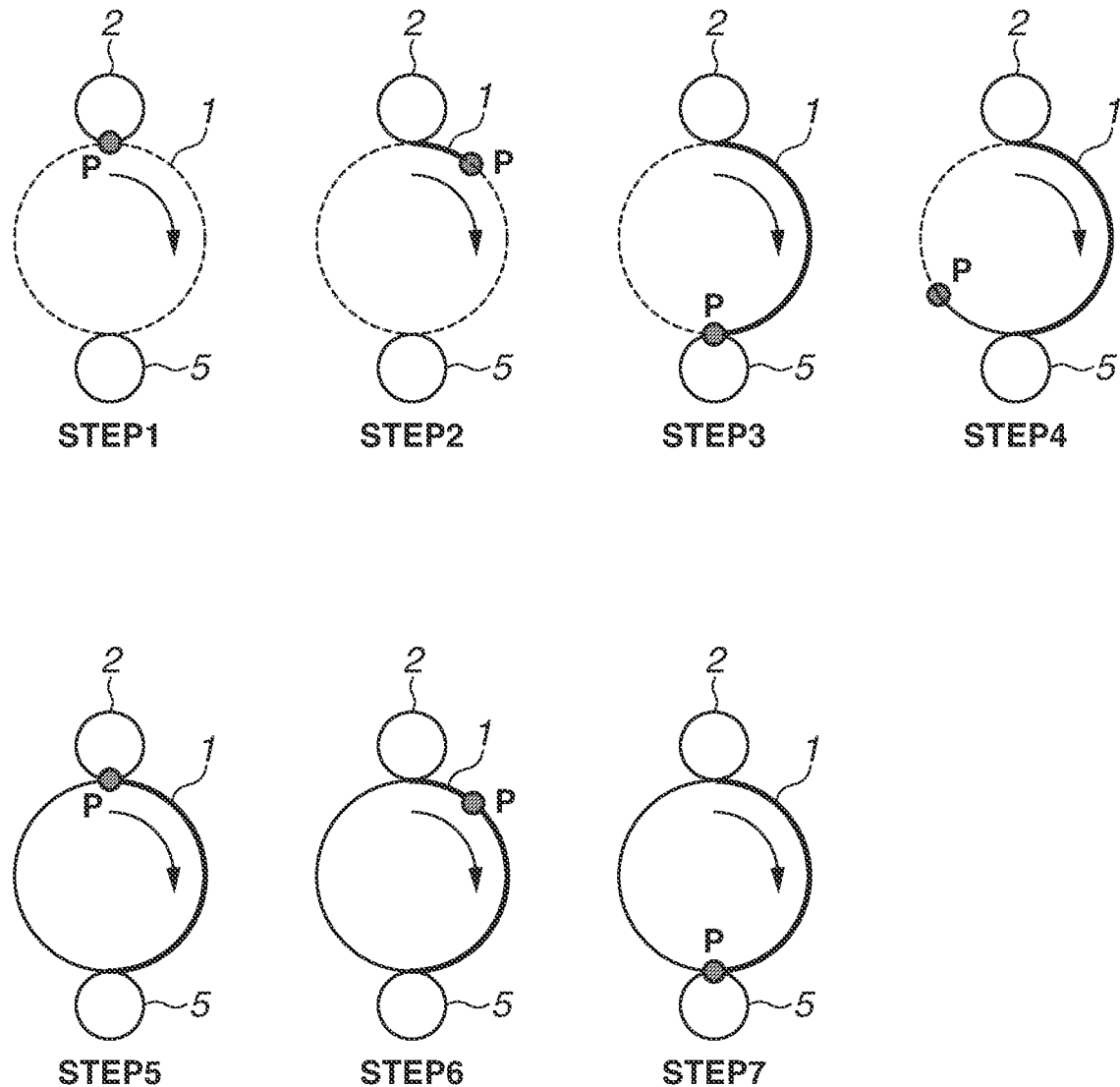
FIG. 5 illustrates a change in a surface potential of a photosensitive drum when the current detection is carried out while the positive transfer voltage is applied according to the first exemplary embodiment.
Figure 7:
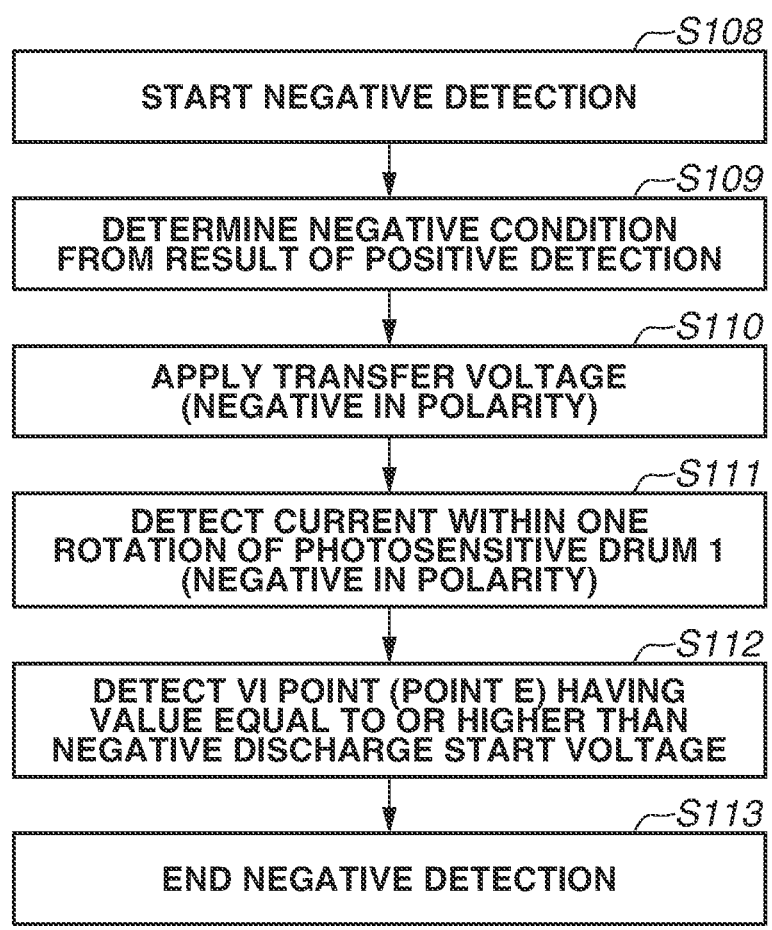
FIG. 7 is a flowchart of current detection when the negative transfer voltage is applied according to the first exemplary embodiment.

The negative current detection corresponds to steps S108 to S113 in the flowchart of FIG. 7 subsequent to step S107 in the flowchart of FIG. 4. The negative current detection according to the first exemplary embodiment is carried out after the positive current detection (step S107). This procedure allows the current at the negative VI point to be accurately detected. If the detected current at the negative VI point is different from the expected detected current at the positive VI point in step S112, a positive VI point of the same current as the negative VI point may be newly calculated from the positive VI line.

S108: Start the negative detection.

S109: Determine the negative application condition corresponding to the negative VI point from the result of the positive current detection, and apply −900 V as the negative voltage because the positive point D (+300 V, 5 µA) is detected with the voltage difference of 600 V in the positive current detection.

S110: Apply the negative transfer voltage of −900 V, which is the same in polarity as the charging voltage.

S111: Carry out the negative current detection within one rotation of the photosensitive drum 1 since the start of step S108.

S112: Detect the point E, which is the VI point having a value equal to or higher than the absolute value of the negative discharge start voltage Vth2.

Detect the point E (−900 V, −5 µA), which is the negative VI point.

S113: End the negative detection.

The state of the surface potential of the photosensitive drum 1 when the negative current detection is carried out according to the flowchart of FIG. 7 in the above-described manner will be described with reference to the schematic cross-sectional view of FIG. 8. A circle mark and a thickness of a solid line and a dotted line in the drawing indicate the potential and the base point P. A thick solid line on the photosensitive drum 1 indicates the surface of the photosensitive drum 1 on which the formed surface potential of the photosensitive drum 1 is negatively higher in polarity than the surface potential of the photosensitive drum 1 after the passing through the charging portion due to the application of the transfer voltage thereto. A solid line on the photosensitive drum 1 indicates the surface of the photosensitive drum 1 on which the surface potential after the passing through the charging portion is formed. A dotted line on the photosensitive drum indicates the surface of the photosensitive drum 1 on which no surface potential is formed. The base point P indicates the point on the surface of the photosensitive drum 1 that is first charged immediately after the photosensitive drum 1 starts to rotate.

The state of the surface potential will be described in order starting from STEP 8 in FIG. 8. First, in STEP 8, the base point P negatively charged at the charging portion moves toward the transfer portion. Ina subsequent step, STEP 9, the charged base point P reaches the transfer portion. Then, the negative transfer voltage having the larger absolute value than the charging voltage is applied to the transfer roller 5, and the current detection of the photosensitive drum 1 is started. When the current of the photosensitive drum 1 is detected in STEP 10, the surface potential of the photosensitive drum 1 at the base point P after the passing through the transfer portion increases negatively in polarity due to the discharge at the transfer portion. In other words, the surface potential of the photosensitive drum 1 is in a state having a larger absolute value than the surface potential of the photosensitive drum 1 after the charging. In STEP 11, the base point P at which the surface potential is formed by the transfer portion reaches the charging portion again. However, because being the negative DC charging, the charging roller 2 creates no discharge and cannot cancel the excessive potential generated at the transfer portion. Then, in STEP 12, the base point P, at which the formed surface potential increases excessively negatively in polarity by passing through the charging portion, moves toward the transfer portion again. In STEP 13, the base point P reaches the transfer portion, but the transfer portion causes a change in the surface potential desired to be determined, and the accuracy of the current detection is deteriorated. Therefore, even if the detection is carried out continuously therefrom, the current value desired to be determined cannot be acquired. If the detection continues, a discharge due to the application of the negative transfer voltage would unintentionally occur at the base point P and lead to detection of a current that is not the current with respect to the surface potential at the charging portion, thereby serving as a cause for incorrect detection of the current value. Further, when the photosensitive drum 1 reaches the second rotation, the surface potential of the photosensitive drum 1 would undesirably exhibit a further noticeable increase in the potential due to the excessive negative potential.

Therefore, in the first exemplary embodiment, when the negative current detection is carried out after the positive current detection is ended, the current detection is completed within one rotation of the photosensitive drum 1 since the start of the application of the negative transfer voltage as described above. In other words, only the current detection in the section of STEP 9 to STEP 10 is carried out. This method prevents the absolute value of the surface potential of the photosensitive drum 1 after the passing through the transfer portion from exceeding the absolute value of the surface potential of the photosensitive drum 1 after the passing through the charging portion, thereby allowing the negative current detection to be correctly carried out. Further, this method succeeds in reducing the duration required for the negative current detection as a further advantageous effect.

Then, in the first exemplary embodiment, the negative current detection has been described assuming that it is carried out under the condition that it is completed within one rotation of the photosensitive drum 1. However, the number of rotations of the photosensitive drum 1 may be determined in consideration of various sequences (driving states), the surface potential affected by the abutment member of the photosensitive drum 1 and the light source, and the like, besides a dark decay, in which the surface potential of the photosensitive drum 1 decays over time, and the process speed. Therefore, this condition is not limited to within one rotation of the photosensitive drum 1, as long as the image forming apparatus 100 is kept in a situation that the surface potential before the passing through the transfer portion is little changed or the change in the surface potential of the photosensitive drum 1 can be detected even when the photosensitive drum 1 rotates a plurality of times. It is desirable to detect the current by the time that the photosensitive drum 1 completes one rotation in the first exemplary embodiment, but it is known that as far as two rotations little affect the detection accuracy regardless of the transfer voltage to apply.

5. Calculation of Surface Potential of Photosensitive Drum 1

The surface potential of the photosensitive drum 1 is calculated based on the VI point at which the transfer voltage is positive in polarity and the VI point at which the transfer voltage is negative in polarity, which are acquired from the above-described positive current detection and negative current detection processes. A method therefor will be described now. This detection method is advantageous because being able to facilitate the detection of the surface potential of the photosensitive drum 1, which is changed due to a change caused by continuous execution of the printing operation, an environmental change, or the like, by detecting the current while applying the transfer voltage around the discharge start voltage Vth. Examples of the change caused by the printing operation include a reduction in the film thickness of the photosensitive drum 1 due to abrasion of the surface of the photosensitive drum 1, an increase in the resistance of the charging roller 2, and contamination of the surface of the charging roller 2 with the toner T. The environmental change mainly refers to a change in the temperature/humidity, and something like the temperature, the absolute humidity, and the relative humidity.

Figure 9:
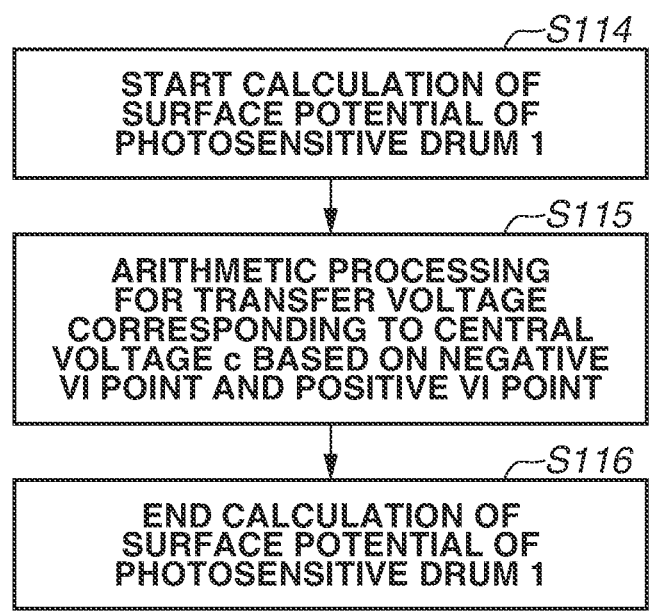
FIG. 9 is a flowchart of calculating the surface potential of the photosensitive drum according to the first exemplary embodiment.

The calculation of the surface potential of the photosensitive drum 1 corresponds to steps S114 to S116 in a flowchart of FIG. 9 subsequent to step S113 in the flowchart of FIG. 7 illustrating the current detection, and is carried out in the following manner.

S114: Start the calculation of the surface potential of the photosensitive drum 1.

S115: Perform the arithmetic processing for the transfer voltage at the middle point corresponding to the central voltage c based on the negative VI point and the positive VI point at which the current in the photosensitive drum 1 has the same absolute value as the negative VI point. The central voltage c is determined by performing the arithmetic processing by the arithmetic unit 154 based on the point E (−900 V, −5 µA), which is the VI point in the region of the negative transfer voltage, and the point D (+300 V, +5 µA), which is the VI point in the region of the positive transfer voltage. Therefore, ((−900)+(+300))/2=−300 V is calculated, and this value, −300 V is the surface potential of the photosensitive drum 1 that is desired to be determined.

Figure 10:
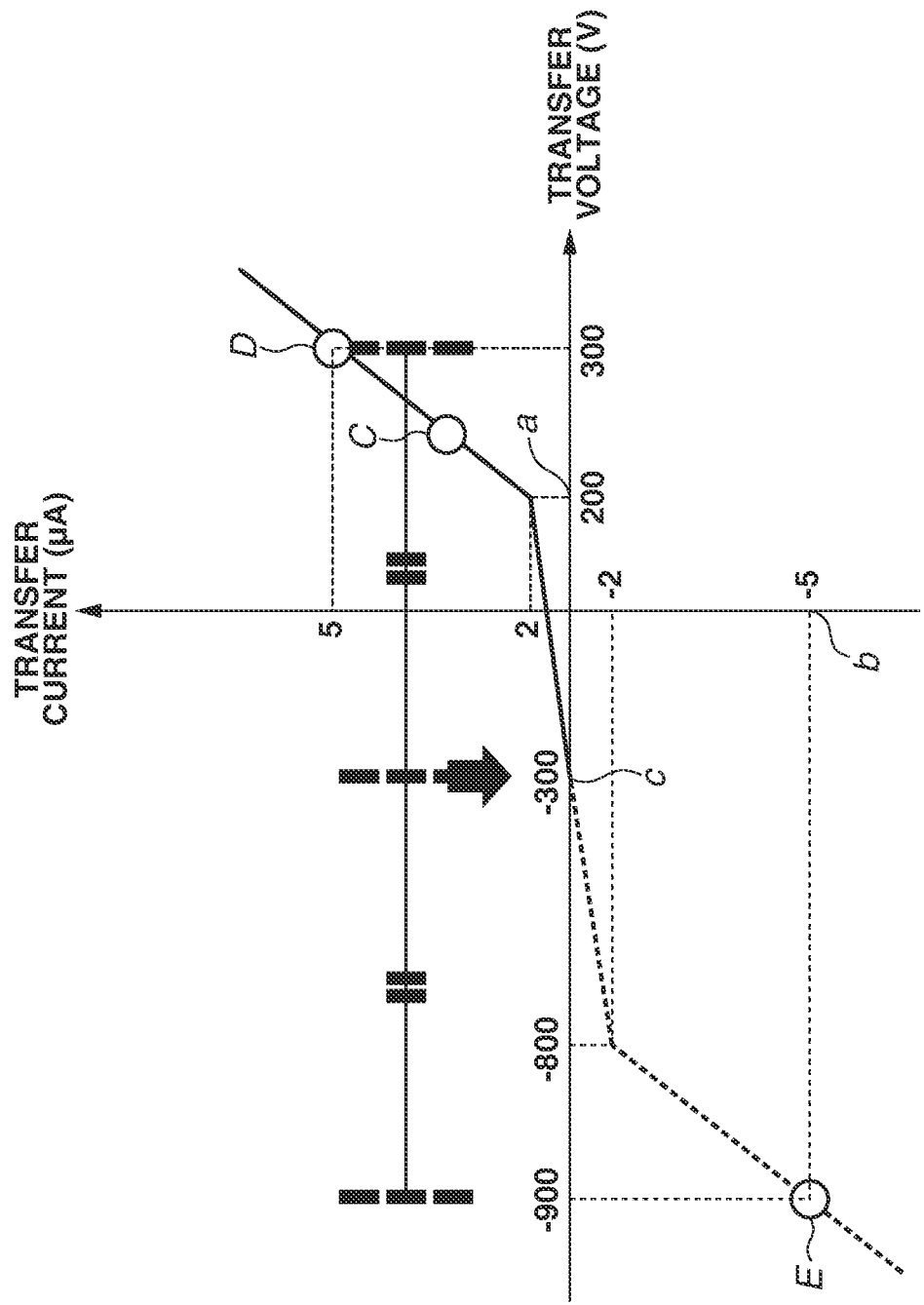
FIG. 10 illustrates the relationship between the transfer voltage and the detected current according to the first exemplary embodiment.

S116: End the calculation of the surface potential of the photosensitive drum 1. In the first exemplary embodiment, based on the point E (−900 V, −5 µA), which is the VI point in the negative transfer voltage region, and the point D (+300 V, +5 µA), which is the VI point in the region of the positive transfer voltage region, the central voltage c between these VI points is determined as illustrated in FIG. 10 and as described above. The equation therefor is ((−900)+ (+300))/2, and the central voltage c: −300 V is calculated. In sum, this method reveals that the surface potential of the photosensitive drum 1 before the passing through the transfer portion, which is desired to be determined, is −300 V.

The detection can be carried out correctly while being less affected by noise or the like, as long as the VI point of the transfer voltage has a voltage value equal to or higher than the discharge start voltage Vth. Next, an example when the VI point of the transfer voltage is the discharge start voltage Vth will be described.

Figure 11:
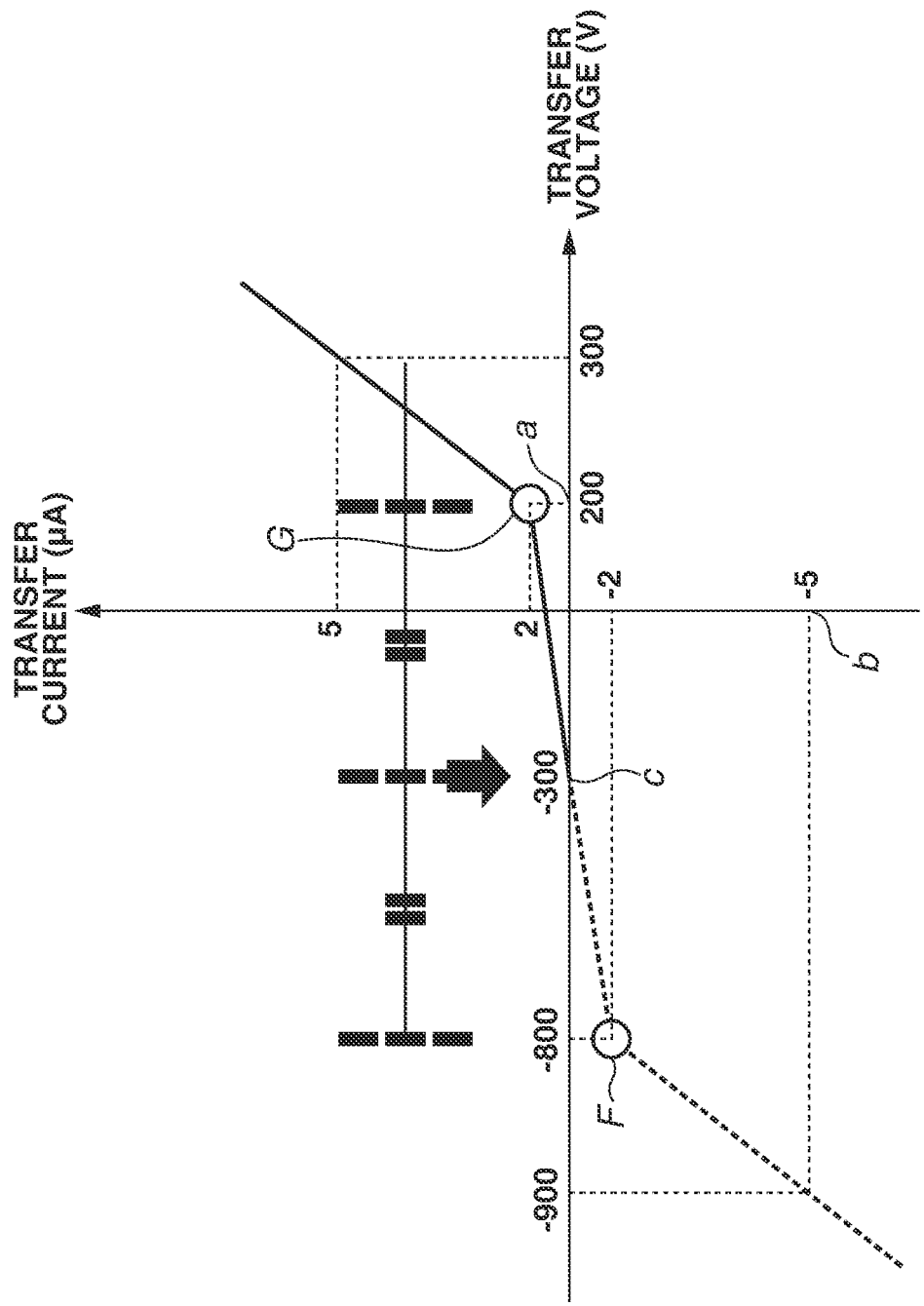
FIG. 11 illustrates the relationship between the transfer voltage and the detected current according to the first exemplary embodiment.

FIG. 11 illustrates the relationship when the VI point of the negative transfer voltage is the point of the discharge start voltage Vth2 (−800 V, −2 µA) at a point F. In this case, the VI point of the positive transfer voltage is also the point of the discharge start voltage Vth1 (+200 V, +2 µA) at a point G, and the equation for calculating the surface potential of the photosensitive drum 1 is expressed as ((−800)+(+200))/2=−300 V in this case. This matches the result of the surface potential of the photosensitive drum 1 that is calculated based on the above-described point D and point E, which are the VI points having values equal to or higher than the discharge start voltages Vth. Therefore, the correct detection can be achieved as long as the positive and negative VI points used to calculate the surface potential of the photosensitive drum 1 have higher absolute values than the discharge start voltages Vth.

In the first exemplary embodiment, the CPU 151 includes the calculation unit 153 and the arithmetic unit 151 for calculating the surface potential of the photosensitive drum 1. The detection unit 110 detects a first current flowing when a region of the photosensitive drum 1 passes through the transfer portion where a second voltage, which is a transfer voltage opposite in polarity from a first voltage as the charging voltage, is applied to the transfer roller 5. After that, the detection unit 110 detects a second current flowing when the region of the photosensitive drum 1 passes through the transfer portion where the second voltage the same in polarity as the first voltage is applied to the transfer roller 5. Then, the calculation unit 153 and the arithmetic unit 154 calculates the surface potential of the photosensitive drum 1 based on voltage values of the negative second voltage and the positive second voltage.

6. Advantageous Effects of Current Detection According to First Exemplary Embodiment Next, differences between the first exemplary embodiment and comparative examples will be described with reference to a table 1.

The adverse effect in the image and the accuracy of the current detection were compared by actually repeating the printing using the configuration according to the first exemplary embodiment and configurations according to a comparative example 1, a comparative example 2, and a comparative example 3. More specifically, using the image forming apparatus 100, 100000 sheets were fed therethrough at a printing ratio of 1%, and evaluations were made on the scraped state of the surface of the photosensitive drum 1, image deletion due to the influence of the discharge product, and a drum memory after the current detection was carried out for every 100 sheets. The table 1 indicates the results of the evaluations.

TABLE 1

|  | Abrasion of Drum | Image Deletion | Drum Memory | Detection Duration |
|---|---|---|---|---|
| First Exemplary Embodiment | ○ | ○ | ○ | ○ |
| Comparative Example 1 | ○ | ○ | ○ | x |
| Comparative Example 2 | x | x | ○ | ○ |
| Comparative Example 3 | x | x | x | ○ |

In the table 1, ○ and x indicate relative superiority/inferiority of each result, and ○ and x mean a superior result and an inferior result, respectively.

The photosensitive drum 1 rotated ten times in the comparative example 1, while the current detection was carried out within one rotation of the photosensitive drum 1 in the configuration according to the first exemplary embodiment.

Then, in the negative current detection, the absolute value of the surface potential of the photosensitive drum 1 increased as the photosensitive drum 1 passed through the transfer portion repeatedly, and this increase made it difficult to carry out the current detection on the surface potential of the photosensitive drum 1 formed due to the discharge at the charging portion. The abrasion of the photosensitive drum 1, the image deletion, and the level of the drum memory were similar to the first exemplary embodiment, which will be described below.

The comparative example 2 was configured to apply the positive and negative charging voltages using the AC charging, and determine the discharge start voltages Vth1 and Vth2 on the positive polarity side and the negative polarity side. The provision of a high-voltage power source for AC charging allows the surface potential of the photosensitive drum 1 after the passing through the transfer portion to be canceled at the charging portion. Therefore, even when the discharge occurs at the transfer portion and the absolute value of the surface potential of the photosensitive drum 1 is increased, this value can be reduced. Although the accuracy of the current detection was high, the use of the comparative example 2 led to an increase in the discharge amount on the photosensitive drum 1 due to the AC charging, thereby facilitating occurrence of the abrasion of the surface of the photosensitive drum 1 and the image deletion due to the generation of the discharge product. On the other hand, the level of the drum memory was excellent.

The comparative example 3 was configured to include the pre-exposure unit, which exposed the surface of the photosensitive drum 1 downstream of the transfer portion at which the photosensitive drum 1 and the transfer roller 5 were in abutment with each other and upstream of the cleaning portion at which the photosensitive drum 1 and the cleaning unit were in abutment with each other in the rotational direction of the photosensitive drum 1. The surface potential of the photosensitive drum 1 after the passing through the transfer portion can be canceled with the aid of the exposure by the pre-exposure unit. Therefore, even when the discharge occurs at the transfer portion and the absolute value of the surface potential of the photosensitive drum 1 is increased, this value can be reduced. Therefore, the accuracy of the current detection was similar to the comparative example 2. However, the comparative example 3 led to an increase in the discharge amount on the photosensitive drum 1 due to the pre-exposure unit, thereby facilitating the occurrence of the abrasion of the surface of the photosensitive drum 1 and the image deletion similarly to the comparative example 2. Further, the drum memory used together with the pre-exposure unit was in a deteriorating direction because accumulating histories more and more therein as the number of printed sheets increased according to a reduction in the sensitivity of the photosensitive drum 1 due to the exposure. The pre-exposure unit was used in the comparative example 3, but the exposure unit 3 may be configured to have a similar function to the pre-exposure unit by causing the surface potential of the photosensitive drum 1 to have a lower absolute value than VI (−200 V) in the first exemplary embodiment.

On the other hand, in the first exemplary embodiment, the image forming apparatus 100 carries out the detection within one rotation of the photosensitive drum 1 when detecting the VI point located in the region of the negative transfer voltage. As a result, the image forming apparatus 100 reduces the discharge amount by the DC charging and also carries out the current detection in the configuration omitting the exposure, thereby being able to prevent the occurrence of the abrasion of the surface of the photosensitive drum 1 and the image deletion. Therefore, the image forming apparatus 100 can achieve the increase in the lifetime, and, in addition, can also improve the accuracy of the current detection and reduce the detection duration.

The image forming apparatus 100 configured in the following manner is used in the first exemplary embodiment. The image forming apparatus 100 includes the rotatable photosensitive drum 1, and the charging roller 2 configured to form the charging portion by contacting the photosensitive drum 1 and charge the surface of the photosensitive drum 1 at the charging portion. Further, the image forming apparatus 100 includes the transfer roller 5 configured to form the transfer portion by contacting the photosensitive drum 1 and contact a region of the photosensitive drum 1 at the transfer portion. The region is charged by the charging roller 2, and the surface potential is formed on the surface of the photosensitive drum 1 in this region. The first voltage, which is the charging voltage including the direct-current component is applied to the charging roller 2 by the first voltage application unit as the charging voltage application unit 21. The second voltage, which is the transfer voltage, is applied to the transfer roller 5 by the second voltage application unit as the transfer voltage application unit 51. The image forming apparatus 100 includes the detection unit 110 configured to detect the current flowing from the transfer roller 5 to the photosensitive drum 1 when the region of the photosensitive drum 1 passes through the transfer portion with the transfer voltage applied to the transfer roller 5, and the control unit 202 configured to control the charging voltage application unit 21 and the transfer voltage application unit 51. The control unit 202 performs control so as to apply the charging voltage to the charging roller 2 in such a manner that the surface potential is formed on the region of the photosensitive drum 1, and apply the transfer voltage the same in polarity as the charging voltage to the transfer roller 5. When the absolute value of the surface potential formed on the region of the photosensitive drum 1 immediately before the entry into the charging portion in this state is larger than the absolute value of the surface potential formed on the region of the photosensitive drum 1 upstream of the transfer portion and downstream of the charging portion in the rotational direction of the photosensitive drum 1, the current detection is carried out in the following manner. In the first exemplary embodiment, the control unit 202 performs control so as to detect the current in the region of the photosensitive drum 1 while the photosensitive drum 1 is rotating once since the region of the photosensitive drum 1 passes through the charging portion.

More specifically, when the region of the photosensitive drum 1 passes through the transfer portion in the state that the transfer voltage opposite in polarity from the charging voltage is applied to the transfer roller 5, the image forming apparatus 100 detects the first current flowing from the transfer roller 5 to the photosensitive drum 1. Then, when the region of the photosensitive drum 1 passes through the transfer portion in the state that the transfer voltage the same in polarity as the charging voltage determined based on the current value of the first current is applied, the image forming apparatus 100 detects the second current flowing from the transfer roller 5 to the photosensitive drum 1. After the transfer voltage opposite in polarity from the charging voltage is applied to the transfer roller 5 with the photosensitive drum 1 rotating and the charging voltage applied to the charging roller 2 so as to form the surface potential on the region of the photosensitive drum 1, the image forming apparatus 100 applies the transfer voltage the same in polarity as the charging voltage. Then, the image forming apparatus 100 detects the second current in the region of the photosensitive drum 1 while the photosensitive drum 1 is rotating once since the region of the photosensitive drum 1 passes through the charging portion. The image forming apparatus 100 according to the first exemplary embodiment is characterized thereby.

In the first exemplary embodiment, because an issue arises when the voltages applied to the charging roller 2 and the transfer roller 5 are the same in polarity as each other, the applied voltage for the charging may be positive in polarity. In this case, the voltages applied to the charging roller 2 and the transfer roller 5 are the same in polarity as each other when the voltage applied to the transfer roller 5 is positive in polarity, and are opposite in polarity from each other when the voltage applied to the transfer roller 5 is negative in polarity, but the configuration according to the first exemplary embodiment may also be employed under this condition.

Further, in the first exemplary embodiment, the detected surface potential of the photosensitive drum 1 has been described focusing on the surface potential of the photosensitive drum 1 when the surface of the photosensitive drum 1 reaches the transfer portion while having a dark decay at a predetermined value after passing through the charging portion. However, the state of the detected surface potential of the photosensitive drum 1 is not limited to the above-described example if similar advantageous effects to the first exemplary embodiment can be acquired when the image forming apparatus 100 detects the surface potential of the photosensitive drum 1 affected by the various sequences (the driving states), the abutment portion, and the light source.

Further, the image forming apparatus 100 applies the transfer voltage to the transfer roller 5 and detects the current flowing in the photosensitive drum 1 to carry out the current detection in the first exemplary embodiment, but the member to which the voltage is applied is not limited to the transfer roller 5. More specifically, a contact member in contact with the photosensitive drum 1 to carry out the current detection may be provided in addition to the transfer roller 5.

Further, the current detection is carried out during an operation other than the image forming operation. For example, the current detection is carried out at the time of a pre-rotation, which is an image forming preparation operation, or at the time of a post-rotation after the image forming operation is ended. Besides them, the timing at which the current detection is carried out can be set as appropriate, and examples thereof include when the image forming apparatus 100 is not used for a long time, when the setting environment is changed, and when the number of printing operations exceeds a threshold value.

Next, another exemplary embodiment of the present disclosure will be described. An image forming apparatus according to a second exemplary embodiment has a basic configuration and operation similar to those according to the first exemplary embodiment. Therefore, the image forming apparatus according to the second exemplary embodiment will be described identifying a component having a function or a configuration similar or corresponding to that of the component of the image forming apparatus 100 according to the first exemplary embodiment by the same reference numeral as the first exemplary embodiment, and omitting a detailed description thereof.

The second exemplary embodiment is different from the first exemplary embodiment in terms of the fact that, at the time of the detection when the charging voltage and the transfer voltage are the same in polarity as each other, a plurality of VI points is detected within one rotation of the photosensitive drum 1 and arithmetic for this plurality of VI points is carried out a plurality of times.

At the time of the detection of the plurality of VI points when the charging voltage and the transfer voltage are the same in polarity as each other, a plurality of currents is detected while the transfer voltage is continuously changed. Due to this method, even when there is unevenness in the potential or a local change in the potential in a circumferential direction of the surface potential of the photosensitive drum 1, the surface potential as the entire photosensitive drum 1 can be determined regardless of the unevenness in the potential at a local specific location by averaging acquired data of the VI points.

Further, even when the data of the VI point cannot be acquired because of, for example, electric noise or a communication error due to the CPU 151 or the storage unit 152, data usable for the detection can be secured by acquiring the plurality of VI points. In this case, the VI point may be determined as a value within a predetermined effective range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-083126, filed Apr. 24, 2019, which is hereby incorporated by reference herein in its entirety.

What is claimed is:

1. An image forming apparatus comprising:
an image bearing member configured to be rotatable;
a charging member configured to form a charging portion by contacting the image bearing member and charge a surface of the image bearing member at the charging portion;
a transfer member configured to form a transfer portion by contacting the image bearing member;
a charging voltage application unit configured to apply, to the charging member, a charging voltage including only a direct-current component;
a transfer voltage application unit configured to apply a voltage to the transfer member;
a detection unit configured to detect a transfer current flowing from the transfer member to the image bearing member; and
a control unit configured to control the charging voltage application unit and the transfer voltage application unit,
wherein, with the image bearing member rotating, the control unit controls the charging voltage application unit to apply the charging voltage to the charging member so as to form a surface potential on a region of the image bearing member and controls the transfer voltage application unit so as to apply, to the transfer member, a transfer voltage that is the same in polarity as the charging voltage, and
wherein, when an absolute value of the surface potential formed on the region of the image bearing member immediately before entry into the charging portion is larger than an absolute value of the surface potential formed on the region of the image bearing member when it is positioned upstream of the transfer portion and downstream of the charging portion in a rotational direction of the image bearing member, the detection unit detects the transfer current when the region passes through the transfer portion with the transfer voltage applied to the transfer member until one rotation of the image bearing member after the region passes through the charging portion.

2. The image forming apparatus according to claim 1, wherein the control unit controls the charging voltage application unit and the transfer voltage application unit in such a manner that an absolute value of a voltage value of the transfer voltage exceeds an absolute value of a voltage value of the charging voltage.

3. The image forming apparatus according to claim 1, further comprising an arithmetic unit configured to calculate the surface potential,
   wherein the control unit is configured to control the charging voltage application unit to apply the charging voltage to the charging member so as to form the surface potential on the region and to control the transfer voltage application unit to apply a first transfer voltage to the transfer member when the region passes through the transfer portion,
   wherein the first transfer voltage is opposite in polarity from the charging voltage, and, after detection of the first transfer voltage at the transfer portion, the control unit controls the transfer voltage application unit to apply a second transfer voltage to the transfer member when the region where the first transfer voltage has been detected passes through the transfer portion again by rotating once,
   wherein the second transfer voltage is the transfer voltage that is the same in polarity as the charging voltage,
   wherein the detection unit is configured to detect a first transfer current when the region passes through the transfer portion with the transfer member being subjected to the application of the first transfer voltage to the transfer member by the transfer voltage application unit, and subsequently to detect a second transfer current flowing from the transfer member to the image bearing member when the region passes through the transfer portion with the transfer member being subjected to the application of the second transfer voltage to the transfer member by the transfer voltage application unit,
   wherein the detection unit detects the second transfer current until the one rotation of the image bearing member after the region passes through the charging portion, and
   wherein the arithmetic unit calculates the surface potential based on a voltage value of the first transfer voltage and a voltage value of the second transfer voltage.

4. The image forming apparatus according to claim 3, wherein the arithmetic unit calculates a voltage value of the transfer voltage that is a middle value between the voltage value of the first transfer voltage and the voltage value of the second transfer voltage as the surface potential.

5. The image forming apparatus according to claim 3, wherein an absolute value of a current value of the first transfer current and an absolute value of a current value of the second transfer current detected by the detection unit are equal to each other.

6. The image forming apparatus according to claim 3, wherein the control unit is configured to control the transfer voltage application unit to apply the first transfer voltage to the transfer member when the region passes through the transfer portion a plurality of times in a plurality of rotations of the image bearing member, and
   wherein the detection unit is configured to detect the first transfer current plural times.

7. The image forming apparatus according to claim 1, wherein the transfer member is a transfer member configured to transfer a toner image formed on the surface of the image bearing member onto a recording material.

8. An image forming apparatus comprising:
   an image bearing member configured to be rotatable;
   a charging member configured to form a charging portion by contacting the image bearing member and charge a surface of the image bearing member at the charging portion;
   a transfer member configured to form a transfer portion by contacting the image bearing member;
   a charging voltage application unit configured to apply, to the charging member, a charging voltage;
   a transfer voltage application unit configured to apply a voltage to the transfer member;
   a detection unit configured to detect a transfer current flowing from the transfer member to the image bearing member; and
   a control unit configured to control the charging voltage application unit and the transfer voltage application unit,
   wherein, with the image bearing member rotating, the control unit controls the charging voltage application unit to apply the charging voltage to the charging member so as to form a surface potential on a region of the image bearing member and controls the transfer voltage application unit so as to apply, to the transfer member, a first transfer voltage when the region passes through the transfer portion,
   wherein the first transfer voltage is opposite in polarity from the charging voltage, and, after detection of the first transfer voltage at the transfer portion, the control unit controls the transfer voltage application unit to apply a second transfer voltage to the transfer member when the region where the first transfer voltage has been detected passes through the transfer portion again by rotating once,
   wherein the second transfer voltage is the same in polarity as the charging voltage,
   wherein the detection unit is configured to detect a first transfer current when the region passes through the transfer portion with the transfer member being subjected to the application of the first transfer voltage to the transfer member by the transfer voltage application unit, and to detect a second transfer current flowing from the transfer member to the image bearing member when the region passes through the transfer portion with the transfer member being subjected to the application of the second transfer voltage to the transfer member by the transfer voltage application unit,
   wherein the detection unit detects the second transfer current until one rotation of the image bearing member after the region passes through the charging portion, and
   wherein the second transfer voltage is determined based on a current value of the detected first transfer current.

9. The image forming apparatus according to claim 8, further comprising an arithmetic unit configured to calculate the surface potential, wherein the arithmetic unit calculates the surface potential based on a voltage value of the first transfer voltage and a voltage value of the second transfer voltage.

10. The image forming apparatus according to claim 9, wherein the arithmetic unit calculates a voltage value of the transfer voltage that is a middle value between the voltage value of the first transfer voltage and the voltage value of the second transfer voltage as the surface potential.

11. The image forming apparatus according to claim 8, wherein an absolute value of a current value of the first transfer current and an absolute value of a current value of the second transfer current detected by the detection unit are equal to each other.

12. The image forming apparatus according to claim 8, wherein the transfer member is a transfer member configured to transfer a toner image formed on the surface of the image bearing member onto a recording material.

\* \* \* \* \*